(12) United States Patent
Duwel et al.

(10) Patent No.: US 8,059,677 B1
(45) Date of Patent: Nov. 15, 2011

(54) SCALABLE CHANNEL BUNDLING WITH ADAPTABLE CHANNEL SYNCHRONIZATION

(75) Inventors: Keith Duwel, Danville, CA (US); Michael Menghui Zheng, Fremont, CA (US); Lana May Chan, Mountain View, CA (US); Showi-Min Shen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 385 days.

(21) Appl. No.: 12/427,960

(22) Filed: Apr. 22, 2009

(51) Int. Cl.
*H04J 3/16* (2006.01)
*H04J 3/22* (2006.01)
*G06F 17/50* (2006.01)
*G06F 7/38* (2006.01)

(52) U.S. Cl. .............. 370/465; 716/100; 326/37
(58) Field of Classification Search .......... 370/465; 716/100; 326/37
See application file for complete search history.

(56) References Cited

U.S. PATENT DOCUMENTS 6,993,671 B2   1/2006   Pricer et al.
2007/0058618 A1   3/2007   Tran et al.
2009/0274131 A1*  11/2009   Lee et al. ............... 370/338

OTHER PUBLICATIONS

U.S. Appl. No. 11/895,594, filed Aug. 24, 2007, Xue et al.

* cited by examiner

*Primary Examiner* — Ronald Abelson
(74) *Attorney, Agent, or Firm* — Mauriel Kapouytian & Treffert LLP; Michael Mauriel

(57) ABSTRACT

Structures and methods to facilitate channel bundling are disclosed. In one embodiment, signal distribution circuitry includes a data path with at least two registers coupled to adjacent sets of data channels in a bundle of data channel sets. In another embodiment, self-switch circuits allow channels in a bundle of channel-sets to switch from bundle-wide signals to locally generated signals after the bundle-wide signals have been synchronously distributed to all channel sets in the bundle. In a particular embodiment, signal distribution circuitry is used to distribute a divided clock signal. In another particular embodiment, signal distribution circuitry is used to distribute enable signals for first-in first-out circuits ("FIFOs") located in channels of each data channel set in a channel set bundle. In a particular aspect of an embodiment, FIFO read and write operations across a channel set bundle are initiated such that a difference between read and write pointer signals is the same in each channel set.

26 Claims, 7 Drawing Sheets

US 8,059,677 B1

SCALABLE CHANNEL BUNDLING WITH ADAPTABLE CHANNEL SYNCHRONIZATION

BACKGROUND

This invention relates generally to the area of system interconnect technology. As integrated circuit (IC) devices increasingly need to support high speed serial interface ("HSSI") protocols, there is an increasing need to bundle physical coding sub-layer ("PCS") data channels. Successfully bundling these channels requires synchronizing clock signals and control signals across multiple channels. However, as HSSI protocols evolve, there is an increasing need to be able to bundle an arbitrarily large number of data channels. A scalable solution that allows for bundling (sometimes called "bonding") a large number of channels is needed. Furthermore, for some applications, once signals distributed across a bundle of channel sets are synchronized, it may be advantageous to rely on local signals rather than remotely generated signals for continued operation. Therefore, a solution that allows for timing the use of both bundle-wide signals and local signals is also needed.

SUMMARY

In one embodiment, signal distribution circuitry includes a data path with registers coupled to adjacent sets of data channels in a bundle of data channel sets. In another embodiment, self-switch circuits allow data channels in a bundle of data channel sets to switch from bundle-wide signals to locally generated signals after the bundle-wide signals have been synchronously distributed to all channel sets in the bundle. In a particular embodiment, signal distribution circuitry is used to distribute a divided clock signal. In another particular embodiment, signal distribution circuitry is used to distribute enable signals for first-in first-out circuits ("FIFOs") located in channels of each data channel set in channel set bundle. In a particular aspect, FIFO read and write operations across a channel set bundle are initiated such that a difference between read and write pointer values is the same in each channel set.

BRIEF DESCRIPTION OF THE DRAWINGS

For purposes of illustration only, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
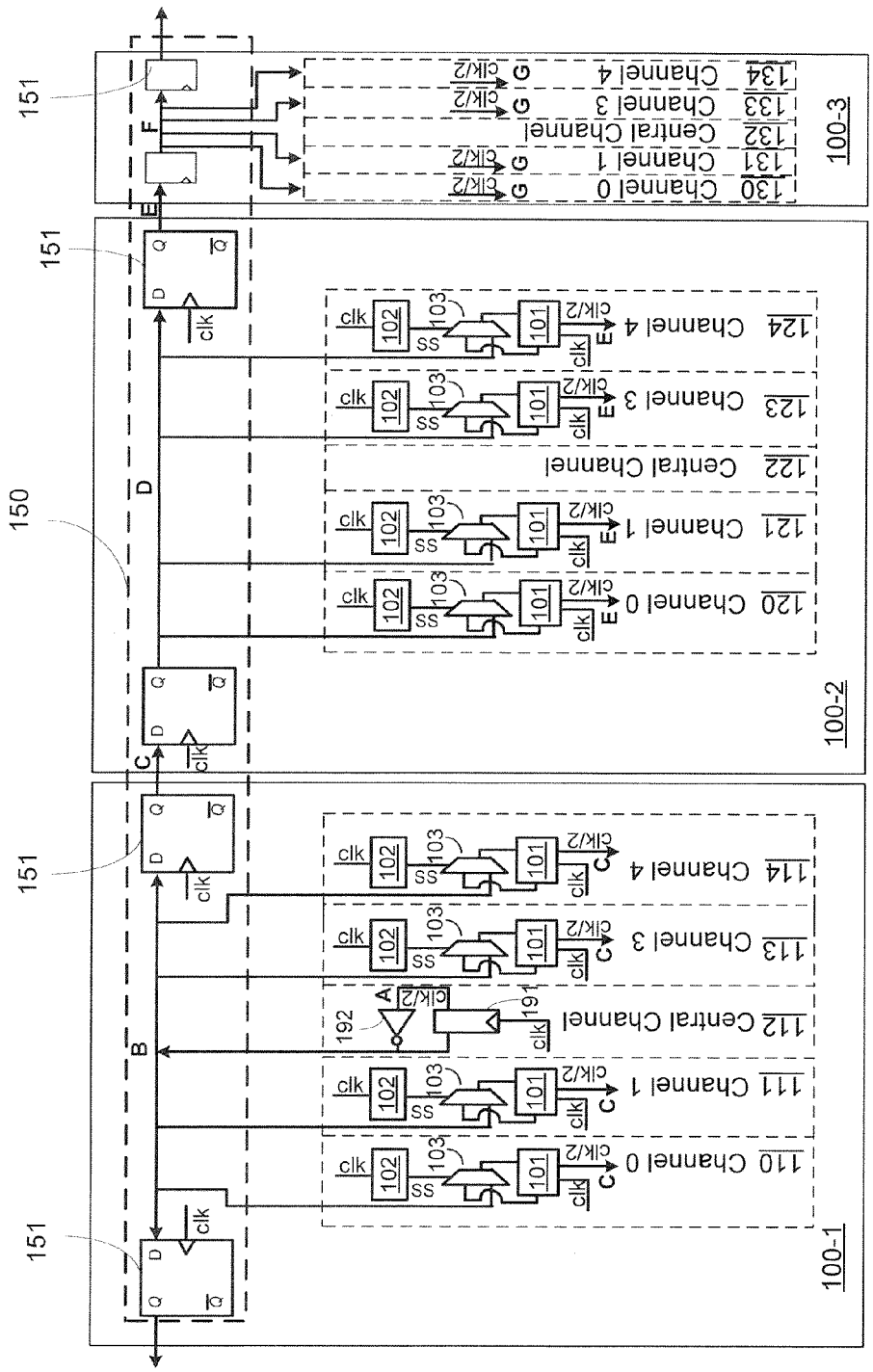
FIG. 1 illustrates signal distribution circuitry in accordance with an embodiment of the present invention implemented in data channel bundle.

FIG. 1 illustrates signal distribution circuitry in accordance with an embodiment of the present invention implemented in data channel bundle 1000. The term "data channel" as used herein simply refers to a collection of circuitry that receives and/or transmits a high speed data stream. Bundle 1000 comprises a plurality of sets of data channels including data channel sets 100-1, 100-2, and 100-3. For ease of explanation, embodiments of the present invention will be described in the context of three data channel sets bundled together; however the principles of the invention apply equally well to bundles including different numbers of data channel sets. Continuing with the description of FIG. 1, Data channel set 100-1 comprises four data channels including channels 110, 111, 113, and 114. In this particular example, data channel set 100-1 is referred to as a "quad" because it has four data channels. However, in other embodiments, a set of data channels may have more or few data channels. Data channel set 100-1 further comprises central channel 112. Central channel 112 includes circuitry for generating various control and/or clock signals used by other data channels in sets 100-1, 100-2, and 100-3. Data channel set 100-2 also comprises four data channels including channels 120, 121, 123, and 124 as well as a central channel 122. Similarly, data channel set 100-3 comprises four data channels including channels 130, 131, 133, and 134 as well as a central channel 132.

When quads (or other size sets) of data channels are bundled together for purposes of a high speed interface, the control and various clock signals for those channels are preferably synchronous. In bundle 1000, quad 100-1 is designated as the "master" quad and quads 100-2 and 100-3 are "slave" quads. "Master" and "slave" in this context simply refer to the fact that the relevant clock signal and control signals used by the entire bundle are synchronized to signals from the master quad 100-1. The phrase "master signal" will be used herein simply as a label to indicate a signal distributed from one quad to other quads as distinguished from a "local" signal generated and used locally in a channel. Clock divider circuitry in central channel 112 comprises register 191 and inverter 192 coupled together as shown. Full speed clock signal CLK (lower case letters used in the drawing) is received at a clock input of register 191 and is used to generate divided clock signal CLK/2 which has a frequency that is half the frequency of full speed clock signal CLK. CLK/2 is delivered to a first input of a multiplexor ("mux") 103 in each of data channels 110, 111, 113, and 114. Each mux 103 is controlled by a self-switch circuit 102. The output of each mux 103 is coupled to a local clock circuit 101 which also receives full speed clock signal CLK. A second input of each mux 103 is coupled to receive output from local clock circuit 101. Data channels 120, 121, 123, and 124 in data channel set 100-2 and data channels 130, 131, 133, and 134 in data channel set 100-3 (like data channels 110, 111, 113, and 114 in data channel set 100-1) each also include a self-switch circuit 102, a mux 103, and a local clock circuit 101, all coupled as shown. This circuitry is present but not separately shown for data channels in channel set 100-3 to avoid overcrowding the drawing.

In the illustrated embodiment, the master quad is shown on the left and drives the relevant signal in one direction to consecutive quads from left to right. However, as one skilled in the art can appreciate, the illustrated embodiment could readily be modified to make a different quad (e.g. 100-2 or 100-3) the master quad instead. In some embodiments, the master quad may drive signals in different directions to slave quads on different sides of the master quad (for example, the illustrated embodiment could be re-designed such that channel set 100-2 serve as the master quad and channel sets 100-1 and 100-3 serve as slave quads).

Channel set bundle 1000 includes bundle-wide distribution circuitry 150 including two registers 151 coupled to adjacent channel sets, lines coupled to the data channels in each channel set (100-1, 100-2, and 100-3), and a line coupled to receive output from central channel 112 in channel set 100-1.

Figure 2:
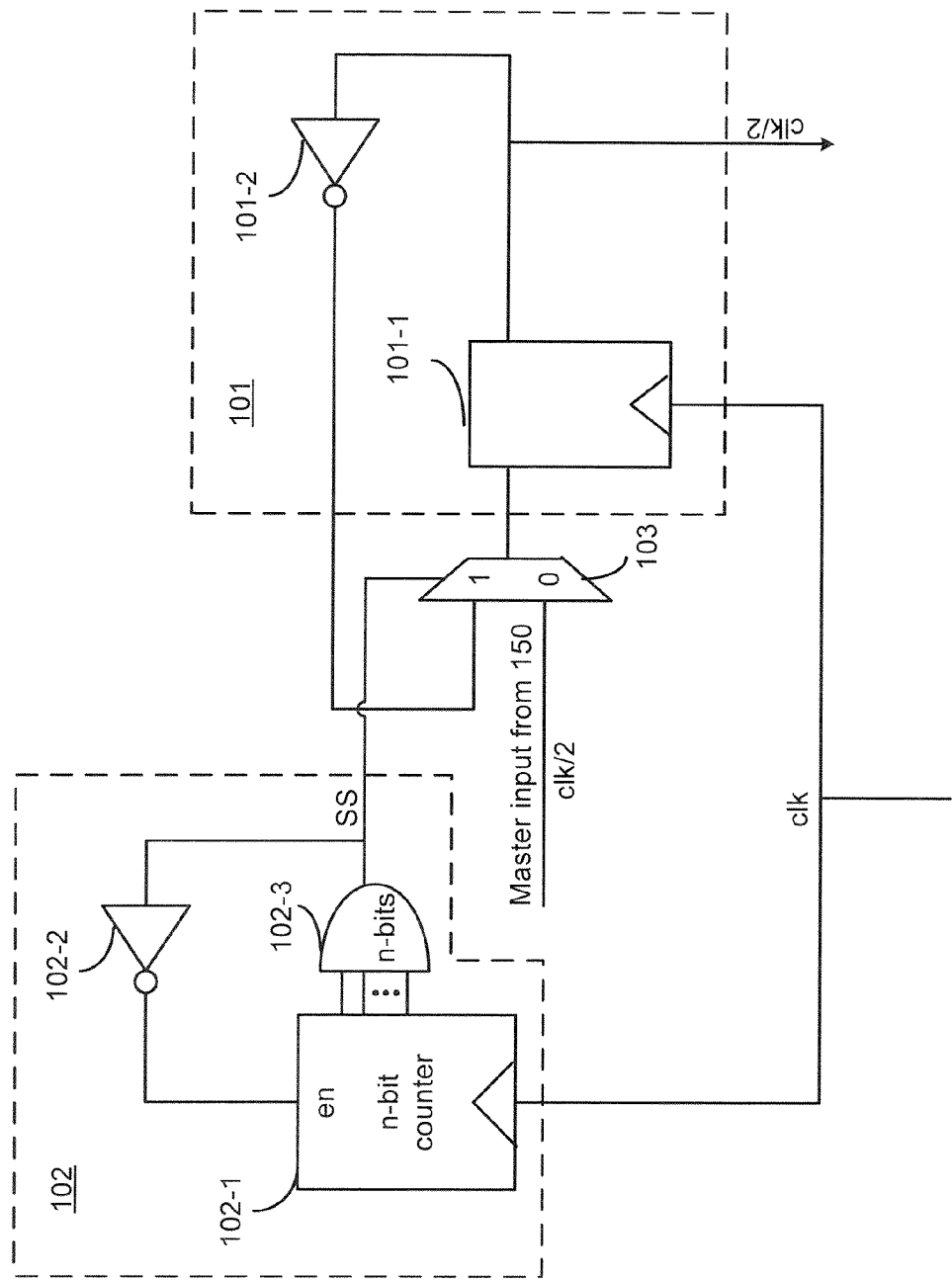
FIG. 2 shows further details of the self switch circuits and local clock circuits of the embodiment of FIG. 1.

FIG. 2 shows further details of the self switch circuits 102 and local clock circuits 101 of the embodiment of FIG. 1. Local clock circuit 101 comprises register 101-1 and inverter 101-2 coupled as shown. Self switch circuit 102 comprises N-bit counter 102-1, AND gate 102-3, and inverter 102-2, all coupled as shown. Self switch circuit 102 is coupled to a control input of mux 103. Initially, the output signal SS of self switch circuit 102 is low and therefore input "0" of mux 103 is selected. Therefore, register 101-1 in local clock circuitry 101 receives a divided clock signal from bundle-wide distribution circuitry 150. N-bit counter 102-1 counts rising edges of full speed clock signal CLK. After a pre-determined count is reached, the output of N-bit counter 102-1 becomes such that N high signals are provided to AND gate 102-3, thus switching the self switch circuit 102's output signal SS from low to high. This switches the control signal for mux 103 so that mux 103 switches to select its "1" input. Prior to the switch, divided clock signal CLK/2 is provided to the channel from bundle-wide distribution circuitry 150 via register 101-1. After this switch, register 101-1, in conjunction with inverter 101-2 acts as a clock divider adapted to divide full speed clock signal CLK and provide a divided clock locally without the channel having to continue receiving a master divided clock from bundle-wide distribution circuitry 150. As will be described further in the context of FIG. 3, the timing for distributing a "master" divided clock CLK/2 from quad 100-1 is such that it reaches destination circuitry in the channels of the furthest quad (quad 100-3) on the fourth rising edge of full speed clock signal CLK. N-bit counter 102-1 is turned on after five cycles of CLK, and therefore, in the present example, a 3-bit counter (which counts to eight or more generally $2^n$ with n=3 in this particular case rising edges of signal CLK before switching from low to high) is sufficient to allow enough time for a master divided clock to be delivered to all quads before switching each channel to a local signal source. This allows all quads to reach synchronicity with respect to the divided clock signal before switching to local control. Local control has the advantage of allowing operations to continue in a particular channel even if the source of the master signal becomes unavailable.

Figure 3:
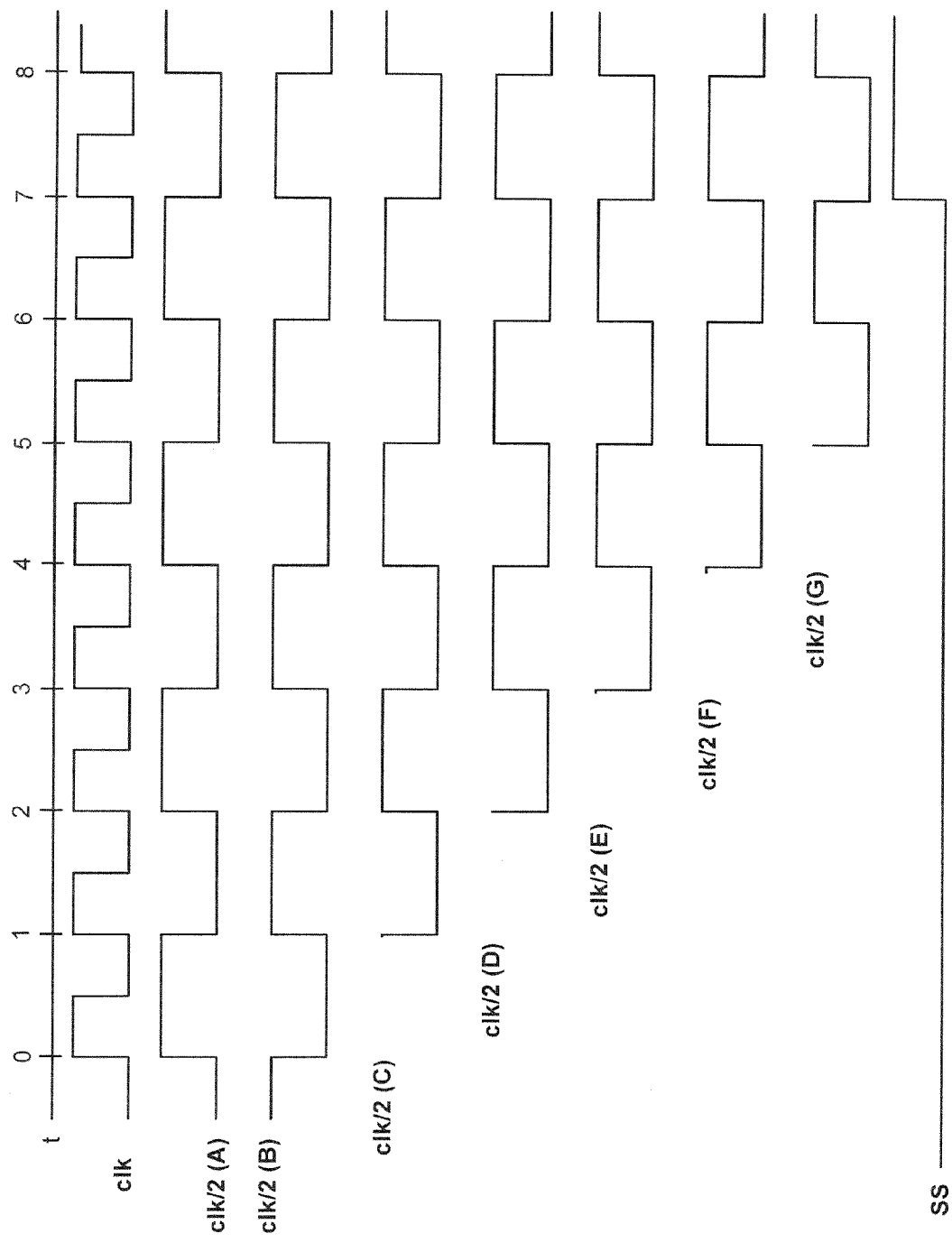
FIG. 3 is a timing diagram illustrating timing for the distribution of certain signals generated in the embodiment illustrated in FIGS. 1 and 2.

FIG. 3 is a timing diagram illustrating timing for the distribution of master divided clock signal CLK/2 from central channel 112 in master quad 100-1 to channels in slave quads 100-2 and 100-3. Full speed clock signal CLK (lower case letters in the drawings) is a clock signal with rising edges and t=0, 1, 2, 3, 4, 5, 6, 7, and 8. With reference to the markers in FIG. 1, at "A", divided clock signal CLK/2 has rising edges at t=0, 2, 4, 6, and 8. At "B" divided clock signal CLK/2 is inverted by inverter 192 and therefore has rising edges at t=1, 3, 5, and 7. At "C" (output of a first register 151 and at the output of circuits 101 in channels 110, 111, 113, and 114) divided clock signal CLK/2 has rising edges at t=2, 4, 6, and 8. At "D" (output of a second register 151), divided clock signal has rising edges at t=3, 5, and 7. At "E" (output of a third register 151 and at the output of circuits 101 in channels 120, 121, 123, and 124), CLK/2 has rising edges at t=4, 6, and 8. At "F" (output of a fourth register 151), divided clock signal has rising edges at t=5 and 7. At "G" (output of a fifth register 151 and at the output of circuits 101 in channels 130, 131, 133, and 134), CLK/2 has rising edges at t=6 and 8. The points of distribution to destination circuitry in the data channels of quads 100-1, 100-2, and 100-3 are, respectively C, E, and G. Note that signal CLK/2 is undefined at C until t=1, at E until t=3, and at G until t=5. However, from t=5 forward, signal CLK/2 is synchronous at its destination points in the data channels of all three quads 100-1, 100-2, and 100-3.

Self-switch signal SS changes from low to high at t=7. After this switch, even if clock signal CLK becomes unavailable in master quad 100-1 (thus disabling the master quad's ability to generate and distribute divided clock signal CLK/2), the slave quads can continue operation using a local divided clock signal. This minimizes the effects of inadvertently losing the operation of a master quad. Moreover, for some applications where fewer quads are needed or channel bonding requirements change, it may be desirable to intentionally turn off an unnecessary master quad to reduce power consumption.

Figure 4:
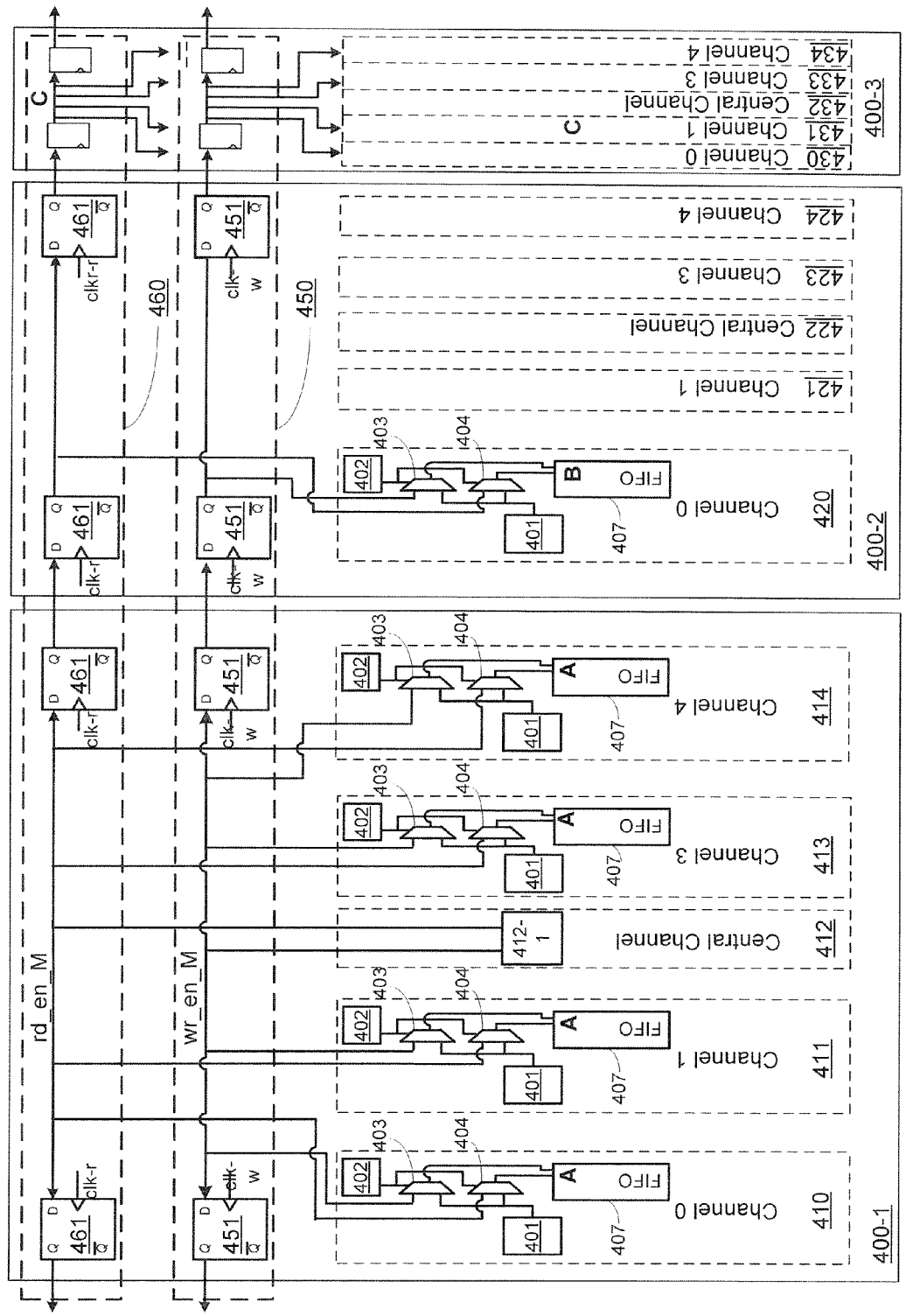
FIG. 4 illustrates signal distribution circuitry in accordance with another embodiment of the present invention implemented in a data channel bundle.

FIG. 4 illustrates signal distribution circuitry in accordance with another embodiment of the present invention implemented in data channel bundle 4000. The embodiments of FIG. 1 and FIG. 4 may be implemented together in the same data channel bundle. Thus reference to another bundle 4000 (in addition to bundle 1000) is only for purposes of easier illustration and explanation. The embodiment of FIG. 4 illustrates use of the principles of the present invention to synchronously distribute control signals. In this example, the control signals are read and write enable signals for first-in first-out circuits ("FIFOs") that reside in each data channel as will be further described below. Bundle 4000 comprises a plurality of sets of data channels including data channel set 400-1, 400-2, and 400-3. Data channel set 400-1 comprises four data channels including channels 410, 411, 413, and 414, and in this particular example, may also be referred to as a "quad." Data channel set 400-1 further comprises central channel 412 used to generate various control and/or clock signals used by data channels in channel sets 400-1, 400-2, and 400-3. Data channel set 400-2 also comprises four data channels including channels 420, 421, 423, and 424 as well as a central channel 422. Similarly, data channel set 400-3 comprises four data channels including channels 430, 431, 433, and 434 as well as a central channel 432.

In bundle 4000, quad 400-1 is designated as the "master" quad and quads 400-2 and 400-3 are "slave" quads. Central channel 412 includes enable signal generator 412-1 for generating master write enable signal wr_en_M and master read enable signal rd_en_M. (Those skilled in the art will appreciate that circuitry for enable signal generator 412-1 can, in a particular example, include circuitry similar to that of the local enable signal circuits 401 further described in the context of FIG. 5.) Each data channel comprises a FIFO 407, a mux 403, a mux 404, a self switch circuit 402, and a local enable signal generator circuit 401. Signal wr_en_M is delivered to a first input of a mux 403 in each of data channels 410, 411, 413, and 414. Signal rd_enable_M is delivered to a first input of a mux 404 in each of data channels 410, 411, 413, and 414. Each mux 403 and 404 is controlled by a self-switch circuit 402. The output of each mux 403 and 404 is coupled to a FIFO 407. A second input of each mux 103 is coupled to receive output from a local enable signal circuit 401. Data channels 420, 421, 423, and 424 in data channel set 400-2 and data channels 430, 431, 433, and 434 in data channel set 400-3 (like data channels 410, 411, 413, and 414 in data channel set 400-1) each include a FIFO 407, a mux 403, a mux 404, a self switch circuit 402, and a local enable signal generator circuit 401. This circuitry is shown in data channel 420 of data channel set 400-2 and is present but not separately shown for the other data channels in data channel sets 400-2 and 400-3 to avoid over-crowding the drawing.

Channel set bundle 4000 includes bundle-wide write enable distribution circuitry 450 including two registers 451 coupled to adjacent channel sets, lines coupled to the data channels in each channel set (400-1, 400-2, and 400-3), and a line coupled to receive output (wr_en_M) from enable signal generator 412-1 in central channel 412 of channel set 400-1. Channel set bundle 4000 also includes bundle-wide read enable distribution circuitry 460 including two registers 461 coupled across each channel set, lines coupled to the data channels in each channel set (400-1, 400-2, and 400-3), and a line coupled to receive output (rd_en_M) from enable signal generator 412-1 in central channel 412 of channel set 400-1.

Figure 5:
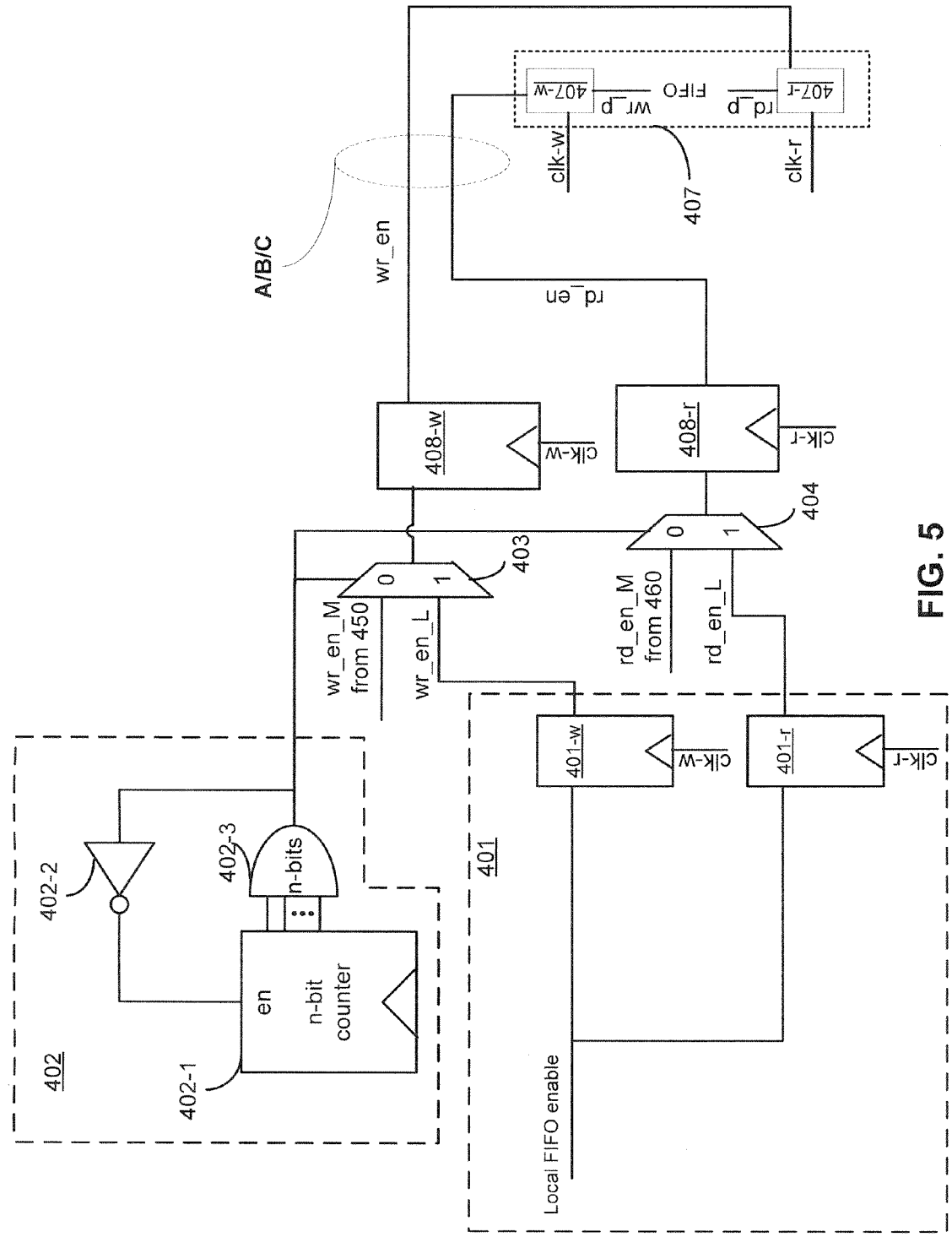
FIG. 5 shows further details of the self switch circuits and local enable generator circuits of the embodiment of FIG. 4.

FIG. 5 shows further details of the self switch circuits 402 and local enable generator circuits 401 of the embodiment of FIG. 4. Local enable generator circuit 401 provides a "high" local enable signal to write enable timing register 401-w and to read enable timing register 401-r. Self-switch circuit 402 comprises N-bit counter 402-1, AND gate 402-3, and inverter 402-2, all coupled as shown. Self switch circuit 402 is coupled to control inputs of muxes 403 and 404. Initially, the output of self switch circuit 402 is low and therefore the "0" inputs of muxes 403 and 404 are selected. Therefore, timing register 408-w receives master write enable signal wr_en_M from bundle-wide write enable distribution circuitry 450 and timing register 408-r receives master read enable signal rd_en_M from bundle-wide read enable distribution circuitry 460. After a pre-determined count of N-bit counter 402-1 is reached, the outputs of N-bit counter 402-1 are such that N high signals are provided to AND gate 402-3, thus switching the output of self-switch circuit 402 from low to high. This switches the control signal for muxes 403 and 404 from low to high so each mux switches to select its "1" input. After this switch, timing registers 408-w and 408-r receive, respectively, local write enable signal wr_en_L and local read enable signal rd_en_L from local enable signal circuit 401. As will be described further in the context of FIG. 6, the timing for distributing "master" read and write enable signals from quad 400-1 is such that the master write enable signal wr_en_M and the master read enable signal rd_en_M reach destination circuitry in the channels of the furthest quad (quad 400-3) after seven clock cycles. Therefore, in the present example, N-bit counter 402-1 is a 3-bit counter (which counts eight clock cycles before switching from low to high) which allows sufficient time for master enable signals to be delivered to all quads before switching each channel to a local enable signal.

Figure 6:
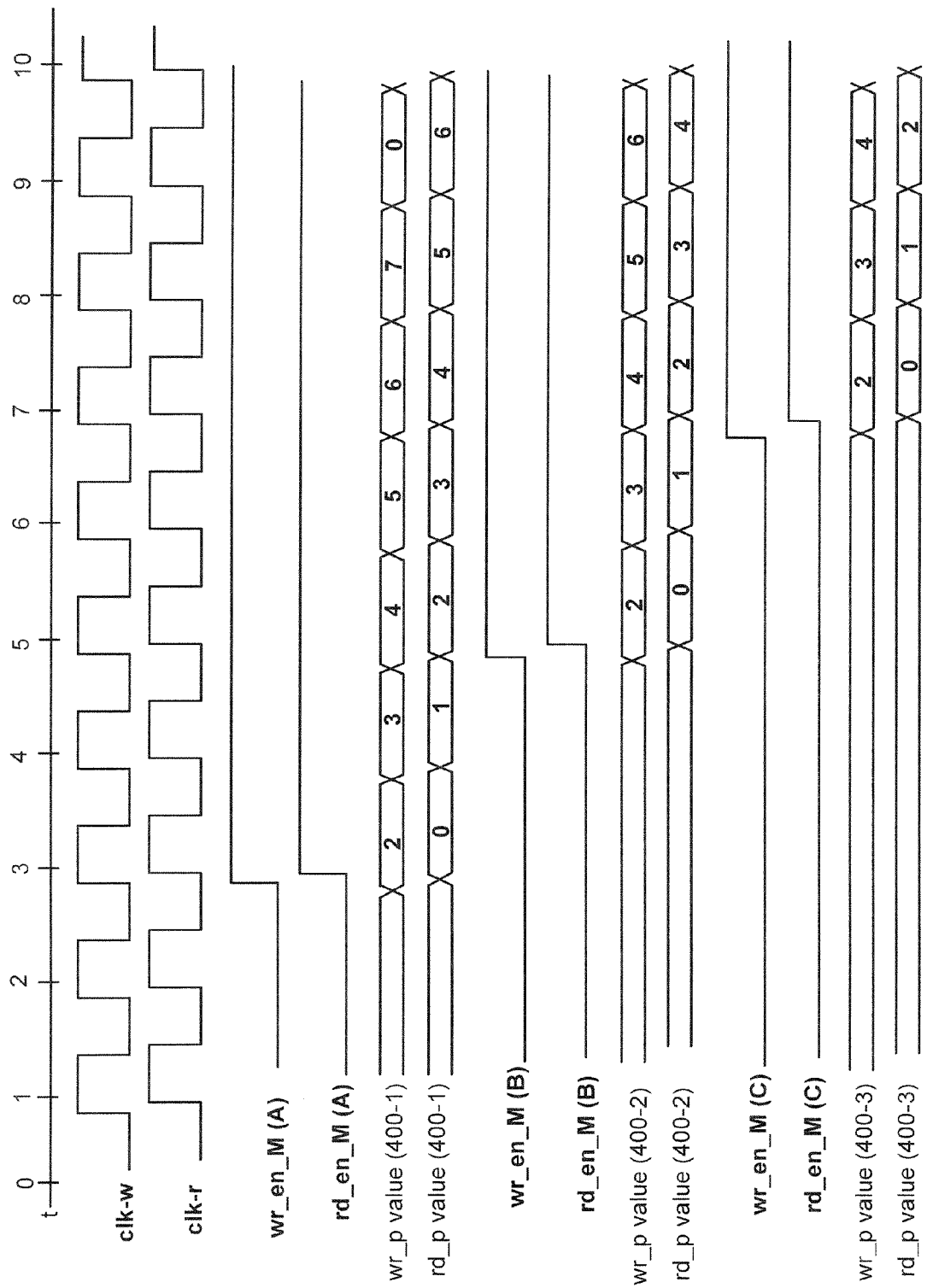
FIG. 6 is a timing diagram that further illustrates the operating principles of the embodiment illustrated in FIGS. 4 and 5.

As illustrated in FIG. 5, FIFO 407 has write control circuitry 407-w and read control circuitry 407-r. Once enabled (i.e., once the wr_en signal it receives goes high), write control circuitry 407-w begins generating a 3-bit write pointer signal wr_p whose value corresponds to a particular location in the FIFO memory. Similarly, once enabled (i.e., once the rd_en signal it receives goes high), read control circuitry 407-r begins generating a 3-bit read pointer signal rd_p whose value corresponds to a particular location in the FIFO memory. In this example, FIFO 407 is an 8-bit circular asynchronous FIFO. In this example, the write clock signal clk-w and the read clock signal ckl-r are the same frequency but have slightly different phases (as illustrated in FIG. 6). When write control circuitry 407-w is enabled (or "reset"), the write pointer wr_p has value of "2" on the first clock cycle, which identifies the "2" location of FIFO 407's memory. On each succeeding clock cycle, the write pointer advances one value to point to a different location of FIFO 407's memory. When the write pointer reaches the "7" location in memory, it returns on the next clock cycle to "0" and begins circling through each memory location again. The read pointer signal generated by read control circuitry 407-r proceeds in similar fashion. However, FIFO 407 is designed such that, when first enabled (or "reset"), the read pointer rd_p points to memory location "0" (in contrast to the write pointer, which points to location "2").

The illustrated embodiment operates on the principle that for circular FIFOs operate in coordinated fashion across multiple quads, it is not necessary for a read (or write) pointer in one quad to simultaneously have the same value as a read (or write) pointer in a second quad. However, to have the same latency through FIFOs in the different channels across multiple quads, it is necessary that the difference in values between the read and write pointers in each quad is the same. For example, if in quad 400-1 write pointer wr_p points to the "7" location and read pointer rd_p points to the "5" location of a FIFO 407's memory and, at the same time, in quad 400-3, write pointer wr_p points to the "3" location and read pointer rd_p points to the "1" location of a FIFO 407's memory, then the FIFOs 407 in both quads can operate together for channel bundling purposes. Even though the write and read pointers have different values in the two quads, the space between the write and read pointers in each quad is the same. I.e., in each quad, the write pointer is pointing to a location in memory that is two spaces ahead of the location pointed to by the read pointer.

FIG. 6 is a timing diagram that further illustrates the operating principles of the embodiment illustrated in FIGS. 4 and 5. The timing of the write and read enable signals is shown with respect to the "A," "B," and "C" locations marked in FIG. 4. With reference to FIG. 5, each location corresponds to an input of a FIFO 407's control circuitry 407-w and 407-r. As shown in FIG. 4, location "A" references input to FIFOs 407 in quad 400-1, location "B" references input to FIFOs 407 in quad 400-2, and location "C" references input to FIFOs 407 in quad 400-3.

As shown in FIG. 6, write clock signal clk-w read cock signal clk_r have the same frequency but slightly different phases. With reference to the illustrated time line, both have rising edges slightly before t=1, 2, 3, 4, 5, 6, 7, 8, 9, and 10. At location A (in quad 400-1), the write enable signal wr_en (from master signal wr_en_M) and the read enable signal rd_en (from master signal rd_en_M) go high slightly before t=3. Once the master write enable signal wr_en_M goes high, write control circuits 407-w for FIFOs 407 in quad 400-1 begin generating a write pointer signal starting with a value of 2 and advance the value once each clock cycle. Once the master read enable signal rd_en_M goes high read control circuits 407-r begin generating a read pointer signal starting with a value of 0 and advance the value once each clock cycle. Therefore, at t=3, in quad 400-1, the value of write pointer wr_p is 2 and the value of read pointer rd_p is 0.

At location B (in quad 400-2), the write enable signal wr_en (from master signal wr_en_M) and the read enable signal rd_en (from master signal rd_en_M) go high just before t=5. Therefore, at t=5, in quad 400-1, the value of write pointer wr_p is 2 and the value of read pointer rd_p is 0.

A location C (in quad 400-3), the write enable signal wr_en (from master signal wr_en M) and the read enable signal rd_en (from master signal rd_en_M) go high slightly before t=7. Therefore, at t=7, in quad 400-3, the value of write pointer wr_p is 2 and the value of read pointer rd_p is 0.

After t=7, all FIFOs 407 have had their write and read functions enabled. With reference to FIG. 6, just past t=7, the write and read pointers are 6 and 4 in quad 400-1, 4 and 2 in quad 400-2, and 2 and 0 in quad 400-3. Thus, although these signals have different values in different quads, the difference between their values remains the same as each signal advances circularly from 0-8. Therefore, from t=7 forward, the FIFOs 407 in all three quads are operating sufficiently together for channel bonding.

In one embodiment, after the master enable signals wr_en_M and rd_en_M have been distributed from master quad 400-1 to slave quads 400-2 and 400-3, the enable signals switch to local control as described above in the context of FIG. 5.

Data channel bundles 1000 in FIG. 1 and/or 4000 in FIG. 4 and associated distribution and self-switch circuitry may be implemented as part of input/out ("I/O") circuitry—for example, as part of physical coding sub-layer ("PCS") circuitry in any IC. A specific example of an IC is a programmable logic device ("PLD"). PLDs (also referred to as complex PLDs, programmable array logic, programmable logic arrays, field PLAs, erasable PLDs, electrically erasable PLDs, logic cell arrays, field programmable gate arrays, or by other names) provide the advantages of fixed ICs with the flexibility of custom ICs. PLDs have configuration elements (i.e., programmable elements) that may be programmed or reprogrammed. Placing new data into the configuration elements programs or reprograms the PLD's logic functions and associated routing pathways. Such configuration may be accomplished via data stored in programmable elements on the IC. Programmable elements may include dynamic or static RAM, flip-flops, electronically erasable programmable read-only memory (EEPROM) cells, flash, fuse, anti-fuse programmable connections, or other memory elements. Configuration may also be accomplished via one or more externally generated signals received by the IC during operation of the IC. Data represented by such signals may or may not be stored on the IC during operation of the IC. Configuration may also be accomplished via mask programming during fabrication of the IC. While mask programming may have disadvantages relative to some of the field programmable options already listed, it may be useful in certain high volume applications.

Figure 7:
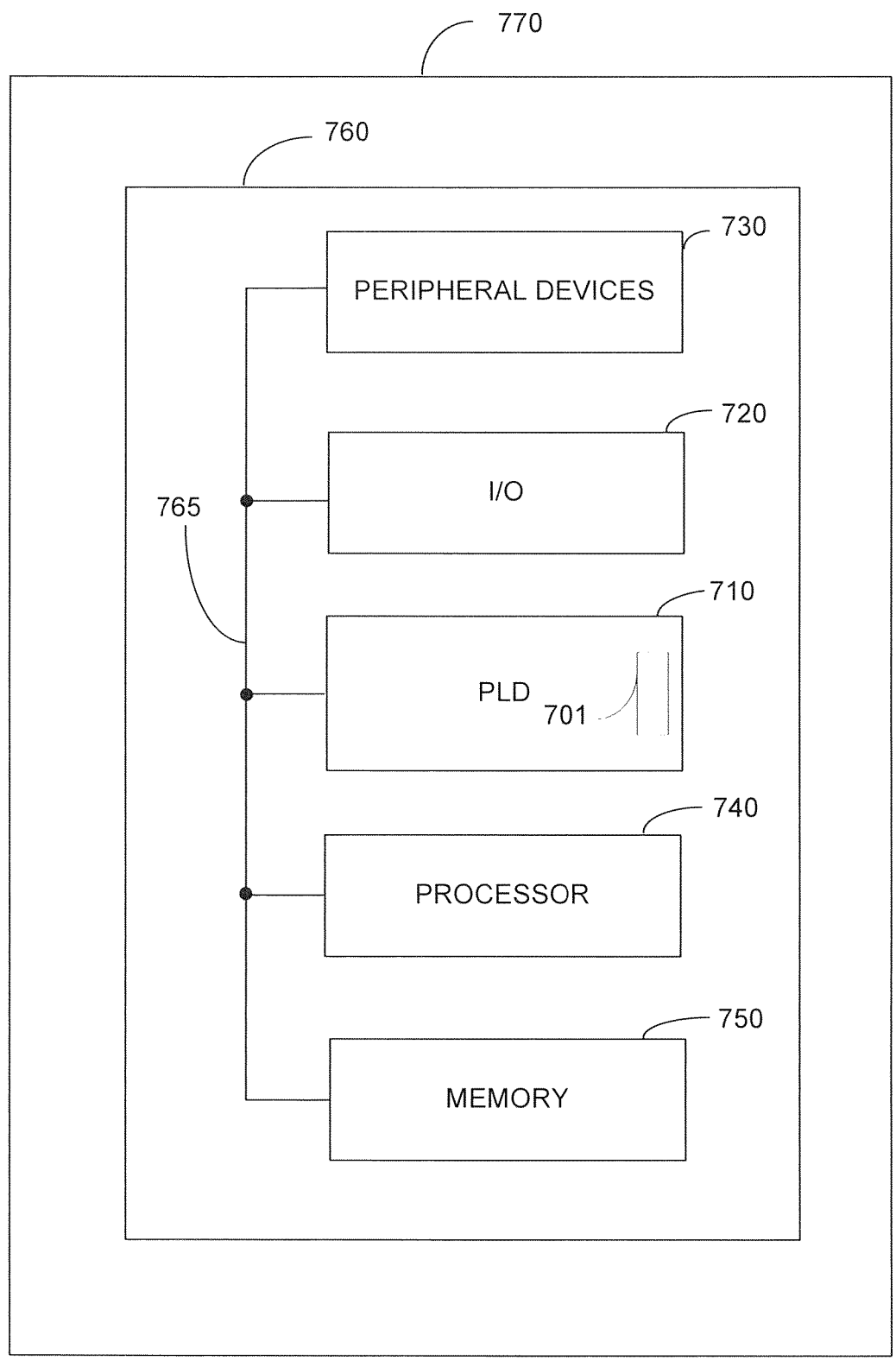
FIG. 7 illustrates an exemplary data processing system including a transceiver in a programmable logic device ("PLD"), the transceiver including circuitry in accordance with an embodiment of the present invention.

FIG. 7 illustrates an exemplary data processing system 700 including a PLD 710. PLD 710 includes a transceiver 701 with PCS circuitry including channel set bundles in accordance with an embodiment of the present invention. For ease of illustration, includes a signal path with at least two registers coupled in series to respective sets of adjacent I/O data channels, each of the registers coupled to receive and distribute the first signal. For ease of illustration, FIG. 7 illustrates only a single transceiver 701; however, a PLD such as PLD 710 may include multiple transceivers 701.

Data processing system 700 may include one or more of the following additional components: processor 740, memory 750, input/output (I/O) circuitry 720, and peripheral devices 730 and/or other components. These components are coupled together by system bus 765 and are populated on circuit board 760 which is contained in end-user system 770. A data processing system such as system 700 may include a single end-user system such as end-user system 770 or may include a plurality of systems working together as a data processing system.

System 700 can be used in a wide variety of applications, such as computer networking, data networking, instrumentation, video processing, digital signal processing, or any other application where the advantage of using programmable or reprogrammable logic in system design is desirable. PLD 710 can be used to perform a variety of different logic functions. For example, PLD 710 can be configured as a processor or controller that works in cooperation with processor 740 (or, in alternative embodiments, a PLD might itself act as the sole system processor). PLD 710 may also be used as an arbiter for arbitrating access to shared resources in system 700. In yet another example, PLD 710 can be configured as an interface between processor 740 and one of the other components in system 700. It should be noted that system 700 is only exemplary.

In one embodiment, system 700 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but only by the following claims.

What is claimed is:

1. Signal distribution circuitry in a bundle of data channel sets of an integrated circuit ("IC") device comprising:
   bundle-wide distribution circuitry coupled across the data channel sets to distribute a master signal from a first data channel set to a plurality of other data channel sets;
   a plurality of local signal circuits, each one coupled in a data channel of the bundle of data channel sets to provide a local signal;
   a plurality of selection circuits, each coupled to select either an output of the bundle-wide distribution circuitry or an output of a local circuit to provide to circuitry of a data channel; and
   self-switch circuits coupled to control each of the selection circuits.

2. The signal distribution circuitry of claim 1 wherein the bundle-wide distribution circuitry includes a signal path with at least two registers coupled in series to respective adjacent data channel sets, each of the registers coupled to receive and distribute the master signal.

3. The signal distribution circuitry of claim 2 wherein the at least two registers are positive-edge triggered flip-flops.

4. The signal distribution circuitry of claim 1 wherein the master and local signals are divided clock signals and the local signal circuits are configurable to either distribute the master signal to circuitry of a data channel or to generate the local signal from a full-speed clock signal.

5. The signal distribution circuitry of claim 4 where the local signal circuits each include a local register including an output coupled to an input through an inverter and through a selection circuit of the plurality of selection circuits.

6. The signal distribution circuitry of claim 1 wherein the self-switch circuit is arranged to switch a selection of the selection circuitry from output of the bundle-wide distribution circuitry to output of a local signal circuit.

7. The signal distribution circuitry of claim 6 wherein the self-switch circuit is adapted to switch the selection after the master signal has been distributed to pre-determined number of data channel sets.

8. The signal distribution circuitry of claim 7 wherein the pre-determined number of data channel sets is at least three.

9. The signal distribution circuitry of claim 1 in physical coding sub-layer ("PCS") circuitry of the IC device.

10. A programmable logic device comprising the signal distribution circuitry of claim 1.

11. First-in first-out ("FIFO") control signal distribution circuitry in a bundle of data channel sets of an integrated circuit ("IC") device comprising:
   bundle-wide distribution circuitry coupled across the data channel sets to distribute a master control signal from a first data channel set to a plurality of other data channel sets, the bundle-wide distribution circuitry including a signal path with at least two registers coupled in series to respective adjacent data channel sets, each of the registers coupled to receive and distribute the first master control signal.

12. The FIFO control signal distribution circuitry of claim 11 wherein the signal path is a first signal path and the master control signal is a master write enable signal, the bundle wide distribution circuitry further including a second signal path with at least two registers coupled in series to respective adjacent data channel sets, each of the registers in the second signal path being coupled to receive and distribute a master read enable signal.

13. The FIFO control signal distribution circuitry of claim 11 wherein the at least two registers are positive-edge triggered flip-flops.

14. The FIFO control signal distribution circuitry of claim 11 further comprising:
   a plurality of local FIFO control signal circuits, each one coupled in a data channel of the data channel sets to provide a local control signal to a FIFO in the data channel;
   a plurality of selection circuits, each coupled to select either an output of the bundle-wide distribution circuitry or an output of a local FIFO control circuit to provide to the FIFO; and
   self-switch circuits coupled to control each of the selection circuits.

15. The FIFO control signal distribution circuitry of claim 11 wherein the plurality of local FIFO control signal circuits include local enable signal circuits.

16. The FIFO control signal distribution circuitry of claim 14 wherein the self-switch circuit is adapted to switch a selection of a selection circuit from output of the bundle-wide distribution circuitry to output of a local FIFO control signal circuit.

17. The FIFO control signal distribution circuitry of claim 16 wherein the self-switch circuit is adapted to switch the selection after the master control signal has been distributed to pre-determined number of data channel sets.

18. The FIFO control signal distribution circuitry of claim 7 wherein the predetermined number of data channel sets is at least three.

19. The FIFO control signal distribution circuitry of claim 11 in physical coding sub-layer ("PCS") circuitry of the IC device.

20. A programmable logic device comprising the FIFO control signal distribution circuitry of claim 11.

21. A method of distributing first-in first-out ("FIFO") control signals to a bundle of data channel sets in an integrated circuit ("IC") device comprising:
   providing at least one master control signal to FIFOs in a first channel set;
   distributing the at least one master control master signal to FIFOs in a plurality of other channels sets of the bundle of channel sets such that FIFOs in a next channel set in the bundle of channel sets receives the at least one master control signal a pre-determined number of clock cycles after FIFOs in a prior data channel set in the bundle of data channel sets.

22. The method of claim 21 wherein the at least one master control signal includes a write enable signal and a read enable signal.

23. The method of claim 22 further comprising, responsive to receiving the write and read enable signals at FIFOs of the data channel sets, generating write and read pointer signals in the FIFOs such that a difference between a write and a read pointer is the same in each of the data channels sets.

24. The method of claim 21 further comprising:
   providing at least one local control signal in data channels in the bundle of data channel sets; and
   once the at least one master control signal has been distributed to a last channel set of the bundle of channel sets, using the at least one local control signal instead of the master control master signal to control FIFOs in the channels of the bundle of channel sets.

25. The method of claim 21 implemented in a physical coding sub-layer ("PCS") of the IC device.

26. The method of claim 21 implemented in an IC device that is a programmable logic device.

* * * * *